United States Patent
Lee et al.

(10) Patent No.: US 8,553,470 B2
(45) Date of Patent: Oct. 8, 2013

(54) APPARATUS AND METHODS FOR A PHYSICAL LAYOUT OF SIMULTANEOUSLY SUB-ACCESSIBLE MEMORY MODULES

(75) Inventors: Terry R. Lee, Boise, ID (US); Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 13/047,602

(22) Filed: Mar. 14, 2011

(65) Prior Publication Data

US 2011/0164446 A1 Jul. 7, 2011

Related U.S. Application Data

(63) Continuation of application No. 12/179,423, filed on Jul. 24, 2008, now Pat. No. 7,911,819, which is a continuation of application No. 11/311,948, filed on Dec. 19, 2005, now Pat. No. 7,414,875, which is a continuation of application No. 10/434,578, filed on May 8, 2003, now Pat. No. 6,982,892.

(51) Int. Cl.
  *G11C 7/10* (2006.01)
(52) U.S. Cl.
  USPC ............ 365/189.04; 365/189.02; 365/230.02; 365/230.06; 365/238.5
(58) Field of Classification Search
  USPC ............. 365/189.02, 189.04, 230.02, 230.06, 365/238.5
  See application file for complete search history.

(56) References Cited

U.S. PATENT DOCUMENTS

| | | | |
|---|---|---|---|
| 4,951,246 A * | 8/1990 | Fromm et al. | 711/169 |
| 5,040,153 A | 8/1991 | Fung et al. | 365/230.03 |
| 5,513,135 A | 4/1996 | Dell et al. | 365/52 |
| 5,619,471 A | 4/1997 | Nunziata | 365/230.03 |
| 5,748,528 A * | 5/1998 | Campardo et al. | 365/185.13 |
| 5,790,447 A | 8/1998 | Laudon et al. | 365/52 |
| 5,796,662 A | 8/1998 | Kalter et al. | 365/200 |
| 5,831,925 A | 11/1998 | Brown et al. | 365/230.03 |
| 5,857,109 A | 1/1999 | Taylor | 712/37 |
| 5,884,067 A | 3/1999 | Storm et al. | 345/533 |
| 5,973,951 A | 10/1999 | Bechtolsheim et al. | 365/52 |
| 5,995,376 A | 11/1999 | Schultz et al. | 361/788 |
| 6,046,952 A | 4/2000 | Novak et al. | 365/222 |

(Continued)

FOREIGN PATENT DOCUMENTS

| | | |
|---|---|---|
| JP | 410283773 A | 10/1998 |
| JP | 2000207279 A | 7/2000 |
| JP | 2001022638 A | 1/2001 |

*Primary Examiner* — Viet Q Nguyen
(74) *Attorney, Agent, or Firm* — Dorsey & Whitney LLP

(57) ABSTRACT

A layout for simultaneously sub-accessible memory modules is disclosed. In one embodiment, a memory module includes a printed circuit board having a plurality of sectors, each sector being electrically isolated from the other sectors and having a multi-layer structure. At least one memory device is attached to each sector, the memory devices being organized into a plurality of memory ranks. A driver is attached to the printed circuit board and is operatively coupled to the memory ranks. The driver is adapted to be coupled to a memory interface of the computer system. Because the sectors are electrically-isolated from adjacent sectors, the memory ranks are either individually or simultaneously, or both individually and simultaneously accessible by the driver so that one or more memory devices on a particular sector may be accessed at one time. In an alternate embodiment, the printed circuit board includes a driver sector electrically isolated from the other sectors and having a multi-layer structure, the driver being attached to the driver sector.

22 Claims, 8 Drawing Sheets

(56) References Cited

U.S. PATENT DOCUMENTS

| | | | |
|---|---|---|---|
| 6,049,476 A | 4/2000 | Laudon et al. | 365/52 |
| 6,111,757 A | 8/2000 | Dell et al. | 361/737 |
| 6,147,921 A | 11/2000 | Novak et al. | 365/222 |
| 6,148,363 A | 11/2000 | Lofgren et al. | 711/103 |
| 6,185,704 B1 | 2/2001 | Pawate et al. | 714/719 |
| 6,237,108 B1 | 5/2001 | Ogawa et al. | 714/6 |
| 6,295,571 B1 | 9/2001 | Scardamalia et al. | 710/308 |
| 6,370,668 B1 | 4/2002 | Garrett et al. | 714/763 |
| 6,415,364 B1 | 7/2002 | Bauman et al. | 711/155 |
| 6,584,588 B1 | 6/2003 | Pawate et al. | 714/719 |
| 6,587,393 B2 | 7/2003 | Ayukawa et al. | 365/230.03 |
| 6,636,935 B1 | 10/2003 | Ware et al. | 711/5 |
| 6,640,282 B2 | 10/2003 | MacLaren et al. | 711/115 |
| 6,715,044 B2 | 3/2004 | Lofgren et al. | 711/154 |
| 6,721,226 B2 | 4/2004 | Woo et al. | 365/226 |
| 6,728,851 B1 * | 4/2004 | Estakhri et al. | 711/168 |
| 6,742,098 B1 | 5/2004 | Halbert et al. | 711/172 |
| 6,751,698 B1 | 6/2004 | Deneroff et al. | 710/317 |
| 6,775,759 B2 | 8/2004 | Janzen | 711/217 |
| 6,779,074 B2 | 8/2004 | Janzen | 711/105 |
| 6,839,266 B1 | 1/2005 | Garrett et al. | 365/69 |
| 6,889,304 B2 | 5/2005 | Perego et al. | 711/170 |
| 6,928,892 B2 | 8/2005 | Storbeck et al. | 73/865.8 |
| 6,982,892 B2 * | 1/2006 | Lee et al. | 365/63 |
| 7,089,412 B2 | 8/2006 | Chen | 713/2 |
| 7,139,213 B2 * | 11/2006 | Rao | 365/230.05 |
| 7,142,461 B2 | 11/2006 | Janzen | 365/189.14 |
| 7,155,627 B2 * | 12/2006 | Matsui | 713/401 |
| 7,177,211 B2 | 2/2007 | Zimmerman | 365/201 |
| 7,224,595 B2 | 5/2007 | Dreps et al. | 365/63 |
| 7,369,445 B2 * | 5/2008 | Lee et al. | 365/189.04 |
| 7,414,875 B2 * | 8/2008 | Lee et al. | 365/63 |
| 7,443,759 B1 | 10/2008 | Rowlands et al. | 365/227 |
| 7,911,818 B2 * | 3/2011 | Chu | 365/49.1 |
| 7,911,819 B2 * | 3/2011 | Lee et al. | 365/63 |
| 2003/0206478 A1 | 11/2003 | Ayukawa et al. | 365/230.03 |
| 2012/0201073 A1 * | 8/2012 | Berger et al. | 365/158 |
| 2012/0314488 A1 * | 12/2012 | El Baraji et al. | 365/158 |

\* cited by examiner

APPARATUS AND METHODS FOR A PHYSICAL LAYOUT OF SIMULTANEOUSLY SUB-ACCESSIBLE MEMORY MODULES

CROSS-REFERENCE TO RELATED APPLICATIONS

This application is a continuation of U.S. patent application Ser. No. 12/179,423, filed Jul. 24, 2008, U.S. Pat. No. 7,911,819, which is a continuation of U.S. patent application Ser. No. 11/311,948, filed Dec. 19, 2005, U.S. Pat. No. 7,414,875, which is a continuation of U.S. patent application Ser. No. 10/434,578, filed May 8, 2003, U.S. Pat. No. 6,982,892. These applications and patents are incorporated by reference herein in their entirety and for all purposes.

TECHNICAL FIELD

The present invention relates to memory modules, and more particularly to novel apparatus and methods for a physical layout of simultaneously sub-accessible memory modules.

BACKGROUND OF THE INVENTION

A conventional computer system 10 shown in FIG. 1 includes a central processing unit ("CPU") 12, such as a microprocessor, that is coupled to a bus bridge 16, memory controller or the like. The CPU 12 is also typically coupled to a cache memory 18 to allow instructions and data to be more frequently accessed by the CPU 12. The bus bridge 16 allows the CPU 12 to receive program instructions from a system memory 20. The CPU 12 can also write data to and read data from the system memory 20 through the bus bridge 16. The CPU 12 also preferably transfers video data from the system memory 20 to a display system including a graphics processor or graphics accelerator 24, a video RAM 26, and a conventional display 28, such as a cathode ray tube ("CRT"), liquid crystal display ("LCD") or field emission display ("FED"). The graphics accelerator 24 processes graphics data to free up the CPU 12 from performing that function. The graphics accelerator 24 writes video data to and reads video data from the video RAM 26, and generates a video signal that is applied to the display 28. The bus bridge 16 also interfaces the CPU 12 to a peripheral bus 30, such as a peripheral component interconnect ("PCI") bus. The peripheral bus 30 is, in turn, coupled to at least one mass storage device, such as a disk drive 32 and a CD ROM drive 34, and at least one user interface device, such as a keyboard 36 and a pointing device 38. The computer system 10 may, of course, contain a greater or lesser number of components.

As shown in FIG. 2, the system memory 20 is generally in the form of one or more memory modules 44 that includes several integrated circuit memory devices 40, such as dynamic random access memories ("DRAMs") and which may be Advanced Technology ("AT") Drams, such as RAM-BUS DRAMs ("RDRAMs") or synchronous link DRAMs ("SLDRAMs"), mounted on a printed circuit board 42. Typically, the memory modules 44 are removably plugged into a motherboard 46 of a computer system 10 (FIG. 1). The size of the computer system's memory can be increased by simply plugging additional memory modules 44 into the motherboard 46. Memory modules 44 are commercially available in standardized configurations, such as a single in-line memory module ("SIMM") and a double in-line memory module ("DIMM"). The memory modules 44 are electrically coupled to a memory controller 50 or other device (not shown) mounted on the mother-board 46 using standardized memory interfaces 52. These standardized memory interfaces 52 generally include a data bus, an address bus, and a control/status bus.

Conventional DIMM's have two sides populated with memory devices with each side of the memory module 44 representing an independently addressable memory rank. In conventional memory modules 44, only one rank of memory will be transmitting data at a time, since the memory interface 52 is shared between the two ranks. The physical design for such modules typically consists of one rank on each side of the memory module 44. The printed circuit board (PCB) or module substrate of a conventional memory module 44 has power and ground reference planes that are shared for the entire rank, and in some cases, shared between both ranks of memory.

FIG. 3 shows a top schematic representation of a conventional memory module 44. In this example, each memory rank 62 consists of eight memory devices 40 (e.g. DRAMs). A driver chip 64 is attached to one side of the memory module 44 and is operatively coupled to the memory interface 52 (FIG. 2). The driver chip 64 receives control signals and address signals from the memory interface 52 and multiplexes and routes these signals to the appropriate memory devices 40 on the memory module 44 and receives and de-multiplexes data signals from the memory devices 40 and routes these signals back to the memory interface 52. The PCB typically includes a connector edge adapted for insertion into a corresponding socket of the computer system 10, as disclosed, for example, in U.S. Pat. Nos. 6,111,757 and 5,513,315 issued to Dell et al.

FIG. 3 also shows a PCB stackup 60 of the conventional memory module 44. The PCB stackup 60 includes top and bottom conductive layers S1, S4 which are used as signal routing layers. Ground layers G1, G2 are formed adjacent to the top and bottom signal routing layers S1, S4 which serve as ground planes to deliver the ground connection to the memory devices 40, and to provide a return path for data signals. Next, voltage layers V1, V2 are provided for delivering power to the memory devices 40. Finally, signal layers S2, S3 are provided for command/address and clock signals. The voltage layers V1, V2 may also provide a return path for the command/address and clock signals that may be contained on signal layers S2, S3. The ground layer G1 is a common reference plane for all of the memory modules 40 of rank A, and this ground layer G1 is electrically connected to ground layer G2 using plated through holes (not shown). In some memory modules, a six layer PCB stackup design is used, and the first voltage layer V1 and second ground layer G2 are eliminated, as disclosed, for example, in U.S. Pat. No. 5,973,951 issued to Bechtolsheim et al.

Although desirable results have been achieved using conventional memory module 44 of the type described above, some drawbacks exist. One drawback, for example, is that because the memory interface 52 is shared between the two ranks 62, the driver chip 64 accesses only one memory rank 62 at a time. For advanced data bus configurations having greater bandwidth than conventional 32-bit or 64-bit configurations, memory modules 44 that can only access the memory ranks 62 sequentially cannot fully utilize the capacity of such advanced data bus configurations. Thus, conventional memory modules 44 may hamper the speed at which advanced computer systems may operate.

DETAILED DESCRIPTION OF THE INVENTION

The present description is generally directed toward novel apparatus and methods for a physical layout of simultaneously sub-accessible memory modules. Many specific details of certain embodiments of the invention are set forth in the following description and in FIGS. 4-9 to provide a thorough understanding of such embodiments. One skilled in the art will understand, however, that the present invention may have additional embodiments, or that the present invention may be practiced without several of the details described in the following description.

Figure 1:
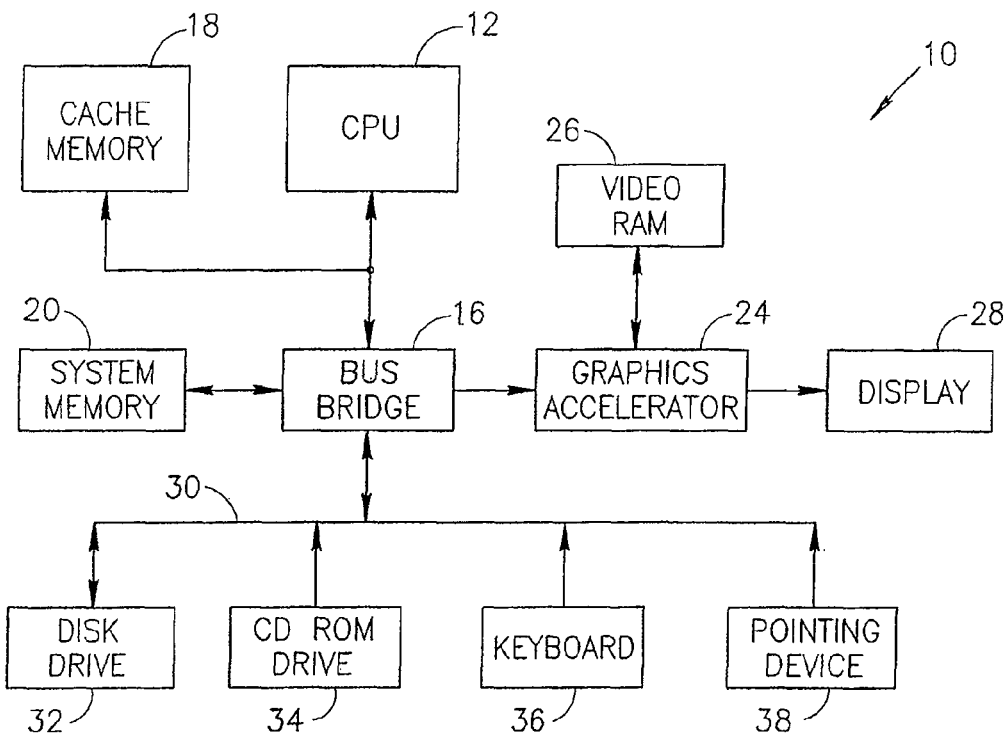
FIG. 1 is a block diagram of a conventional computer system having a system memory.
Figure 2:
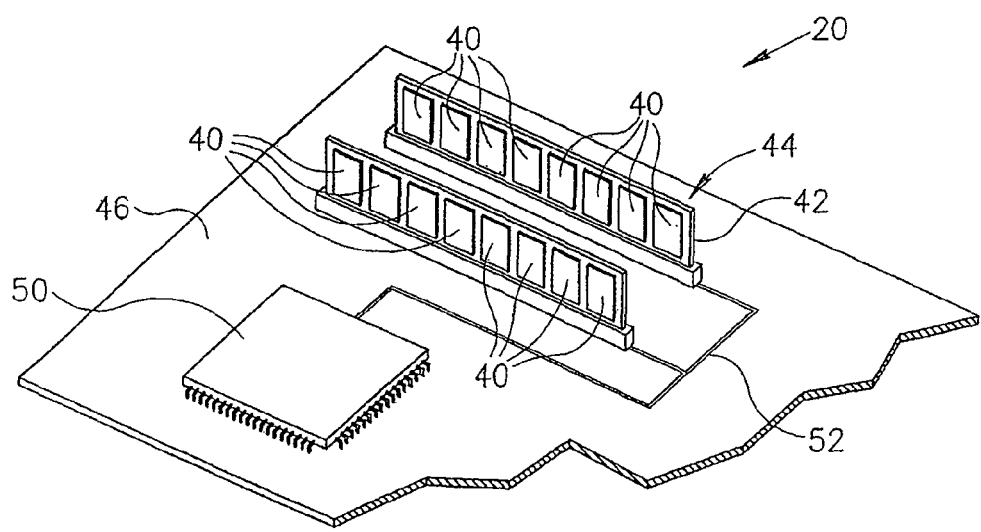
FIG. 2 is an isometric view of a conventional system memory that may be used in the computer system of FIG. 1.
Figure 3:
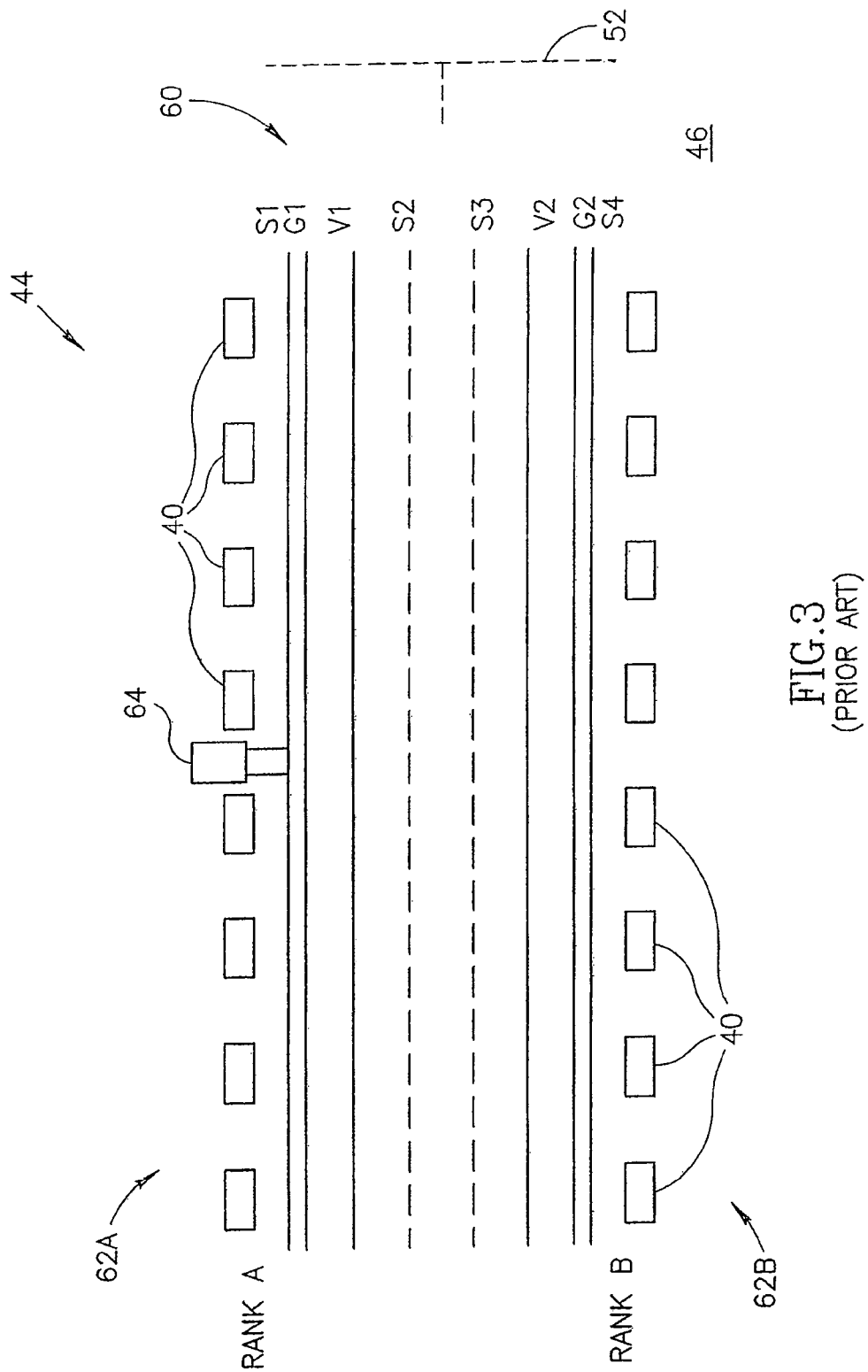
FIG. 3 is a top schematic representation of a conventional memory module of FIG. 2.
Figure 4:
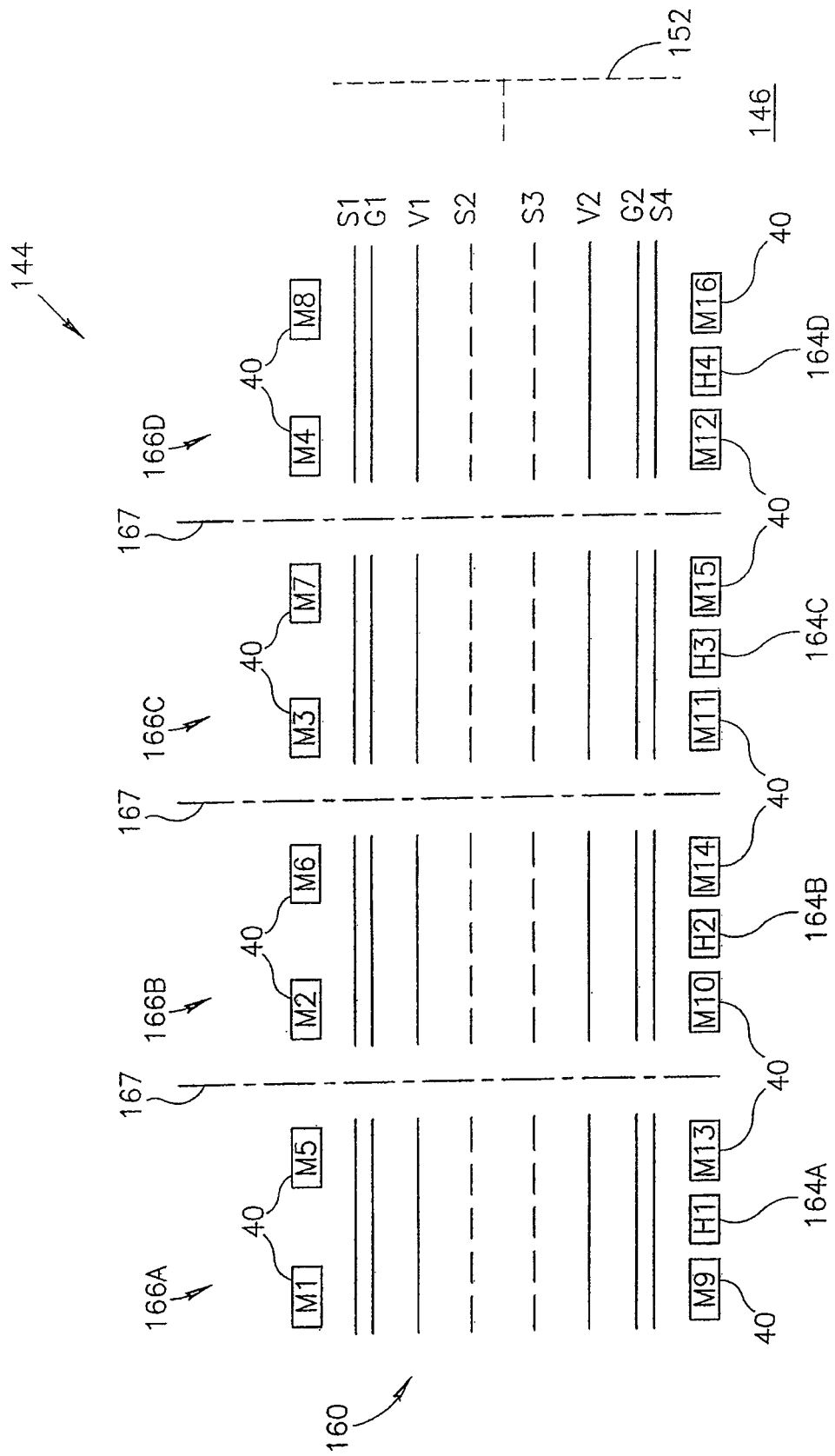
FIG. 4 is a top schematic representation of a memory module in accordance with an embodiment of the invention.
Figure 5:
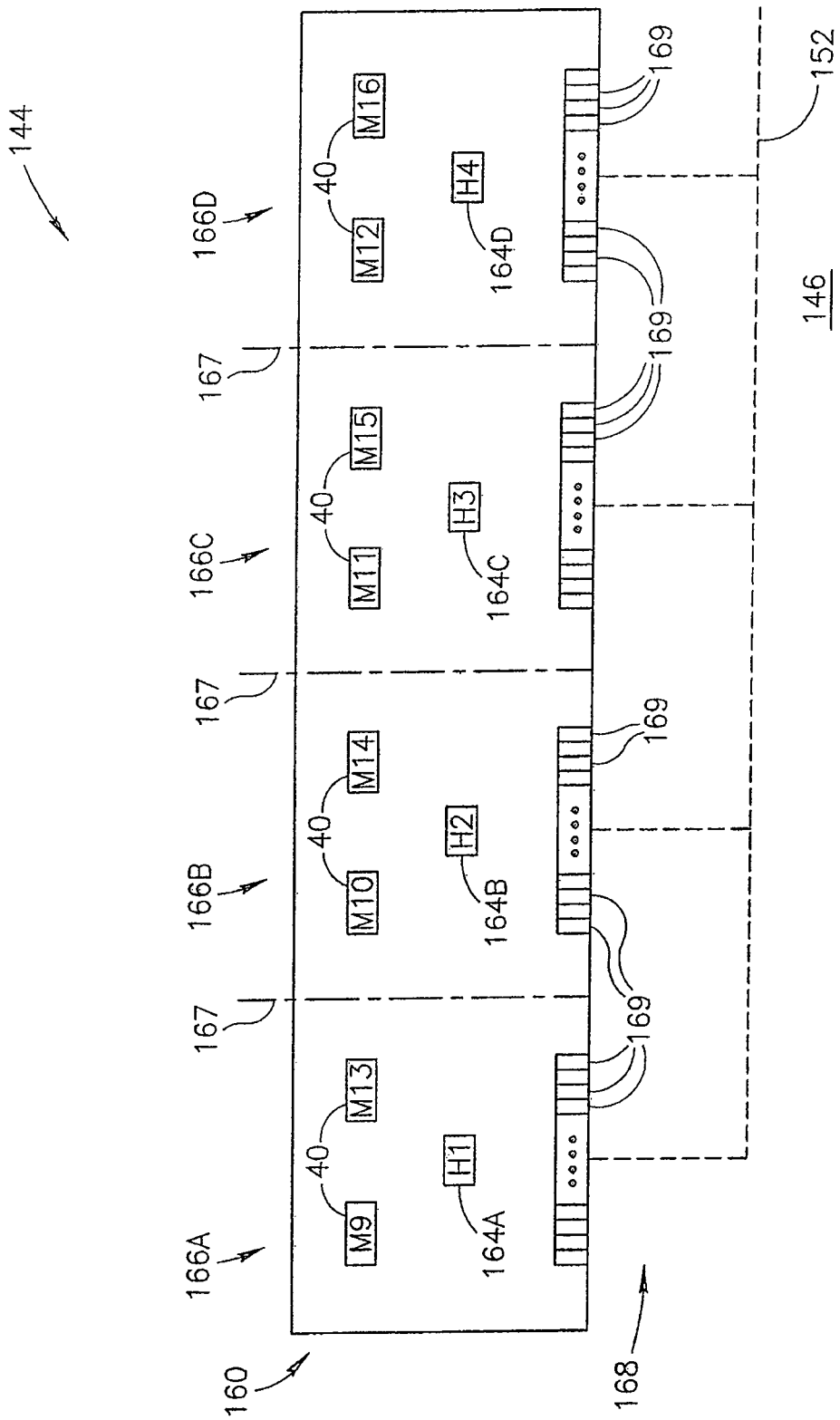
FIG. 5 is a side elevational view of the memory module of FIG. 4.

FIG. 4 is a top schematic representation of a PCB stackup 160 of a memory module 144 in accordance with an embodiment of the invention. FIG. 5 is a side elevational view of the memory module 144 of FIG. 4. In this embodiment, the memory module 144 includes four sectors 166. As shown in FIG. 4, each sector 166 includes first, second, third, and fourth signal layers S1, S2, S3, S4, first and second ground layers G1, G2, and first and second power supply layers V1, V2. Each sector 166 is electrically isolated from adjacent sectors 166, as depicted by sector boundary lines 167. A plurality of memory devices 40 are attached to each sector 166. The memory devices 40 can be conventional memory devices well known in the art. In the embodiment shown in FIGS. 4 and 5, the memory module 144 includes four memory devices 40 attached to each sector 166. A driver 164 is attached to each sector 166. As shown in FIG. 5, the PCB board 160 includes a connector edge 168 having a plurality of pins 169 adapted for insertion into a socket (not shown) on a motherboard 146.

Figure 6:
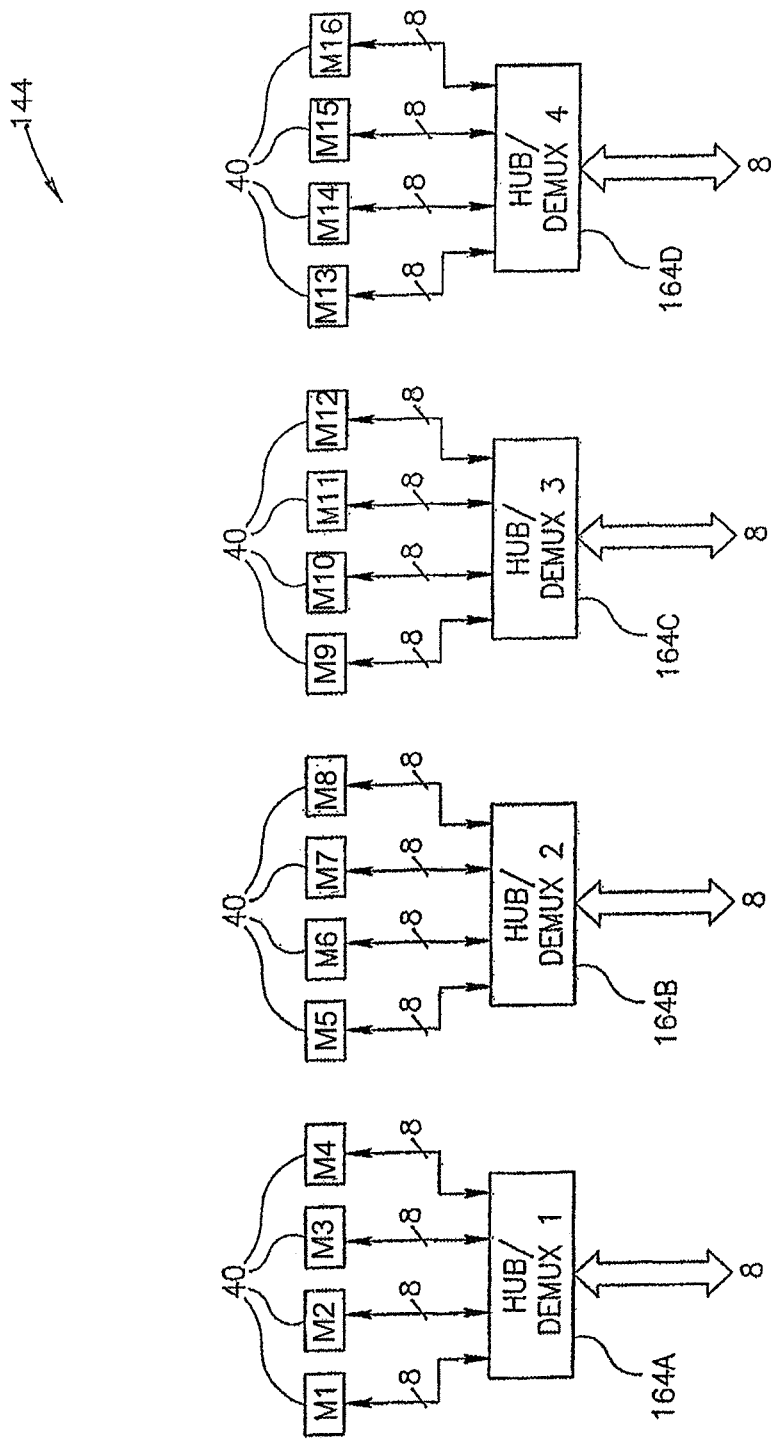
FIG. 6 is a functional block diagram for the components of the memory module of FIG. 4.

FIG. 6 is a functional block diagram for the components of the memory module 144 of FIG. 4. As shown in FIG. 6, each driver 164 is operatively coupled to one of the memory devices 40 in each sector 166. The plurality of memory devices 40 coupled to each driver 164 forms an independently accessible memory sector 166. Again, in the embodiment shown in FIGS. 4-6, the memory module 144 includes four memory sectors 166 each having one driver 164 and four memory devices 40.

More specifically, as shown in FIG. 6, the first driver 164A (attached to the first sector 166A) is operatively coupled to the first memory device M1 (attached to the first sector 166A), the second memory device M2 (attached to the second sector 166B), the third memory device M3 (attached to the third sector 166C), and the fourth memory device M4 (attached to the fourth sector 166D) to form a first memory rank. Similarly, the second driver 164B (attached to the second sector 166B) is operatively coupled to the fifth memory device M5 (attached to the first sector 166A), the sixth memory device M6 (attached to the second sector 166B), the seventh memory device M7 (attached to the third sector 166C), and the eighth memory device M8 (attached to the fourth sector 166D) to form a second memory rank. In like fashion, the third driver 164C is operatively coupled to the ninth, tenth, eleventh, and twelfth memory devices M9, M10, M11, M12 to form a third memory rank, and the fourth driver 164D is operatively coupled to the thirteenth, fourteenth, fifteenth, and sixteenth memory devices M13, M14, M15, M16 to form a fourth memory rank.

One aspect of the embodiment shown in FIGS. 4-6 is that the modules 144 are segmented into sectors 166 (in this case, quadrants). Since the power delivery for each sector 166 is in one relatively small area, and the sector's memory devices 40 are located directly opposite of each other, it may be possible to reduce the number of layers of the PCB stackup 160 to six by eliminating layers V1 and G2. Also, this layout would allow signal return paths to be contained to a single reference plane, which advantageously avoids having the signal cross reference planes, thereby providing improved signal integrity and electromagnetic interference (EMI) characteristics. These aspects may reduce the cost of manufacturing the PCB board 160. Additionally, asynchronous noise caused by the operations occurring in the second sector 166B will not affect the other sectors 166A, 166C, 166D. The motherboard 146 may also continue this segmentation which would maintain the isolation of the different sectors 166. Alternately, the reference planes of the sectors 166 can be connected together on the large plane of the motherboard 146. The relatively large plane and increased area for decoupling capacitors on the motherboard 146 may provide a relatively lower impedance connection, and power noise may be minimized. This approach will also have advantages when the memory devices 40 are accessed simultaneously.

As shown in FIG. 4, in this embodiment, each driver 164 is included in one of the sectors 166, but it is not important on which side of the PCB stackup 160 it is located. The drivers 164 may be of a conventional design, such as the types generally disclosed in U.S. Pat. Nos. 6,237,108, 6,049,476, 5,973,951, and 5,513,135. Alternately, the drivers 164 may be an advanced "hub" design having advanced capabilities of the type disclosed in co-pending, commonly-owned U.S. patent application Ser. No. 10/601,104 to Lee et al., filed on Jun. 19, 2003, U.S. Pat. No. 7,120,727, which is incorporated herein by reference. Each driver 164 may include a memory access device, such as a processor (not shown), or it may simply be a buffer. The drivers 164 are responsible for converting and transmitting signals from processing to memory and vice versa. The memory interface 152 may also be of various embodiments, including, for example, a bus formed by multiple conductors, an optical communication link, an RF communication link, or some other type of high-speed communication link. Similarly, the driver 164 may be used to process electrical signals, RF signals, or optical signals, and can operate in a variety of ways, including, for example, by converting data rate, voltage level, or data scheme to and from the memory modules 160.

One may note that embodiments of memory modules having a greater or fewer number of electrically-isolated sectors 166 may be formed, and that the invention is not limited to the particular memory module embodiment shown in FIGS. 4-6. In alternate embodiments, for example, a greater or fewer number of memory devices 40 may be attached to each sector 166, or a greater or fewer number of memory sectors or ranks may be formed having a greater or fewer number of memory devices 40 per rank. Thus, although the particular memory module 144 shown in FIGS. 4-6 and described above has four sectors 166 with four memory devices 40 per sector and four memory ranks 162 with four memory devices 40 per rank, a variety of alternate embodiments may be conceived and the invention is not limited to this particular embodiment.

Referring again to FIG. 6, in operation, the drivers 164 are adapted for encoding/decoding and multiplexing and de-multiplexing data signals transmitted to and from the memory module 144 via a memory interface 152. For example, control (read or write) and address signals may be received and processed by the drivers 164 to access the appropriate memory device 40 of the memory sector 166 associated with each driver 164 for returning (read) or applying (write) the appropriate data signals to or from the memory interface 152. However, because the memory module 144 is separated into electrically-isolated sectors 166, each memory sector 166 may be accessed independently, and one or more of the memory devices 40 on each memory sector 166 may be accessed simultaneously. Thus, using an advanced memory interface 152, one or more of the memory sectors of a particular memory module may be accessed at the same time. In one embodiment, a maximum serialization of 1:4 is provided to convert each 32-bit wide module interface from each driver 164 into a 128-bit memory data path on the memory interface 152.

The memory module 144 advantageously improves the speed with which memory operations may be performed. Because the modules 144 have a plurality of sectors 166 that are electrically-isolated from adjacent sectors 166, the memory modules 144 allow a plurality of memory sectors to be accessed independently and simultaneously rather than the sequentially-accessible memory modules of the prior art. Each sector 166 (or quadrant as shown in FIGS. 4-6) is independently accessible, and one or more memory devices 40 from a particular memory sector can be accessed simultaneously. Thus, the memory module 144 allows advanced or higher bandwidth buses to be fully utilized compared with conventional memory modules, thereby increasing the speed of the memory system.

One may note that in the event that multiple devices 40 are driven simultaneously, significant power supply noise due to the high peak currents may develop. Additionally, since each sector 166 is now independently accessible, high peak current events, such as activating internal memory banks on a memory device 40, can happen out of phase with sensitive events, such as sensing the row information on a different sector. Additional power and ground planes can be added to the PCB stackup 160 to mitigate power and ground noise problems that may arise due to such operations.

Figure 7:
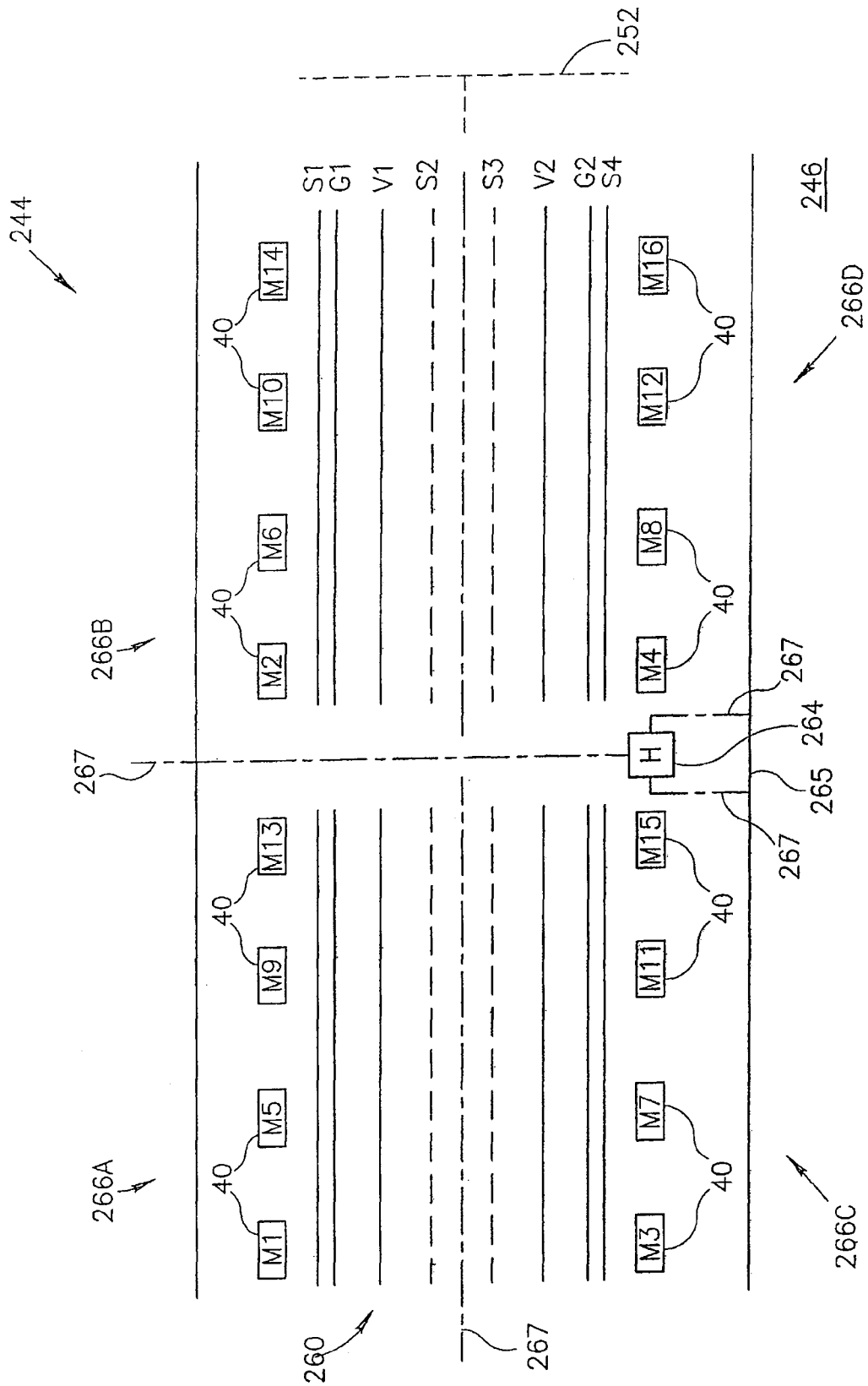
FIG. 7 is a top schematic representation of a memory module in accordance with another embodiment of the invention.
Figure 8:
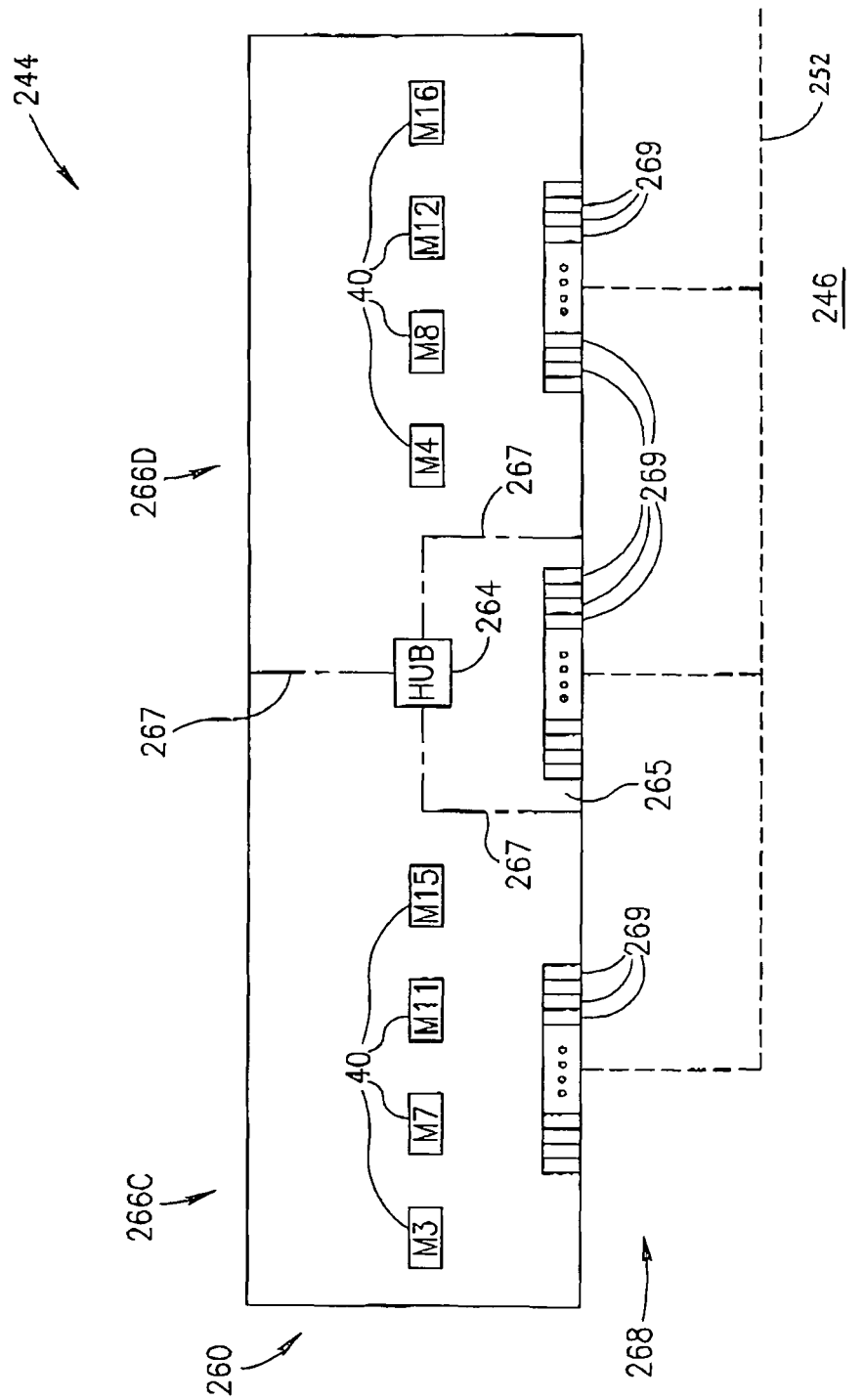
FIG. 8 is a side elevational view of the memory module of FIG. 7.

FIG. 7 is a top schematic representation of a PCB stackup 260 of a memory module 244 in accordance with another embodiment of the invention. FIG. 8 is a side elevational view of the memory module 244 of FIG. 7. In this embodiment, the memory module 244 includes four sectors 266 that are electrically isolated from each other as depicted by sector boundary lines 267. Sectors 266A and 266B include first and second signal layers S1, S2, first ground layer G1, and first power supply layer V1. Similarly, sectors 266C and 266D include third and fourth signal layers S3, S4, second ground layer G2, and second power supply layer V2. A plurality of memory devices 40 are attached to each sector 266. In the embodiment shown in FIGS. 7 and 8, the memory module 244 includes four memory devices 40 attached to each of the four sectors 266A, 266B, 266C 266D. A single driver (or "hub") 264 is attached to a driver sector 265. As shown in FIG. 8, the memory module 244 includes a connector edge 268 having a plurality of pins 269 for insertion into a socket (not shown) on a motherboard 246 for coupling to an interface 252.

Figure 9:
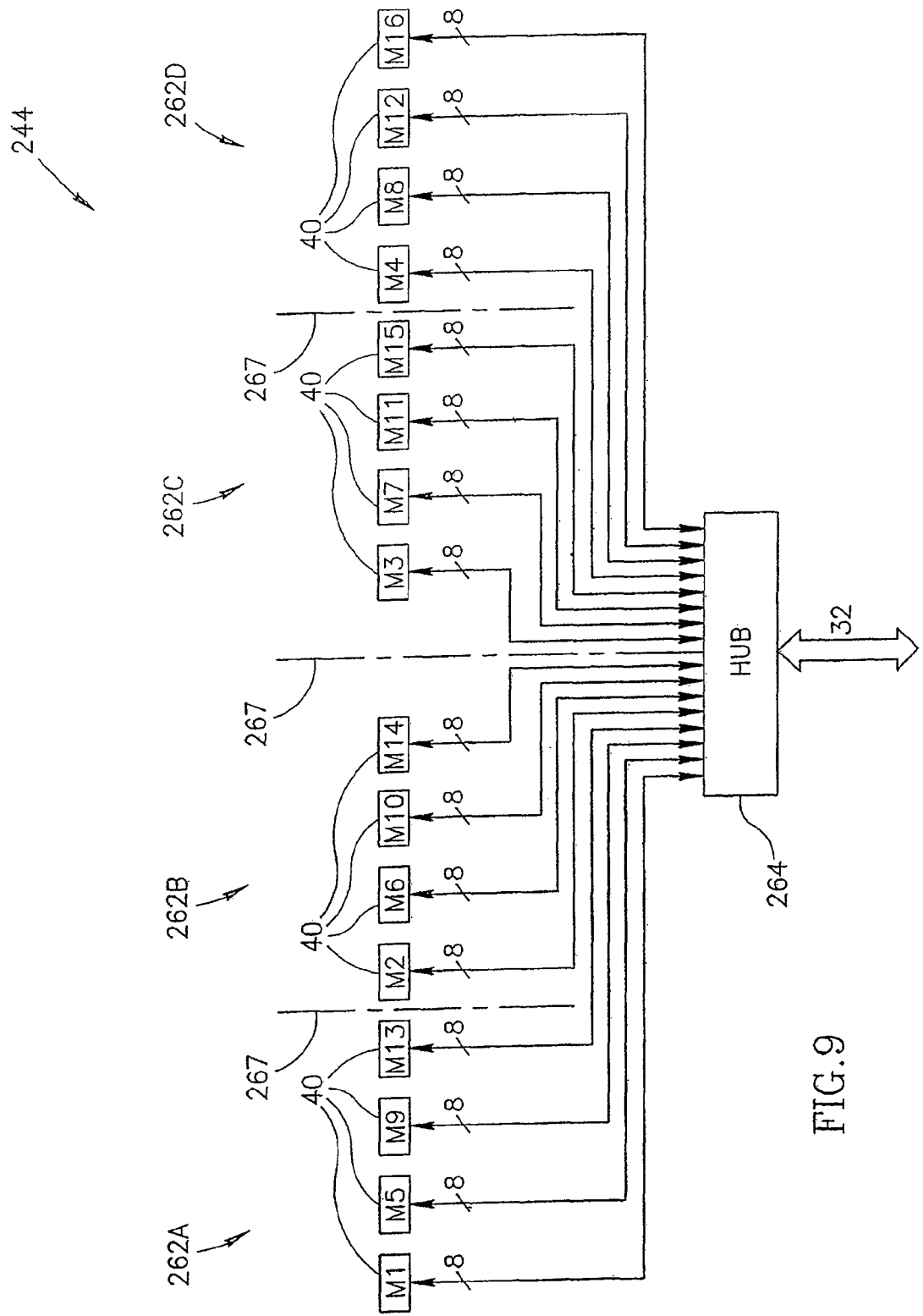
FIG. 9 is a functional block diagram for the components of the memory module of FIG. 7.

FIG. 9 is a functional block diagram for the components of the memory module 244 of FIG. 7. As shown in FIG. 9, the driver 264 is operatively coupled to the memory devices 40 in each sector 266. The plurality of memory devices 40 are organized into four independently and simultaneously accessible memory ranks 262. In this embodiment, each memory rank 262 includes four memory devices 40. The first memory rank 262A includes the first four memory devices M1, M5, M9 and M13, the second memory rank 262B includes the next four memory devices M2, M6, M10 and M14, the third memory rank 262C includes the next four memory devices M3, M7, M11 and M15, and the fourth memory rank 262D includes the last four memory devices M4, M8, M12 and M16.

As described above, each memory rank 262 will have independent command/address signals, and the reference planes of the sectors 266 are segmented to allow independent delivery of power and ground and signal return paths to and from each sector 266. The driver 264 is positioned on its own driver sector 265 to allow the driver 264 to have its own power and ground planes. As described above, the power and ground segments can continue through the connector 268 with independent power and ground connections and can continue in this fashion through the motherboard 246, or the planes can be common on the motherboard 246.

As described above, the memory module 244 provides improved speed. The memory ranks 262 of the memory module 244 may be accessed independently and simultaneously so that one or more memory ranks 262 on a particular module may be simultaneously accessed rather than the sequentially-accessible memory modules of the prior art. Thus, the memory module 244 is able to process memory access requests more rapidly, and can more fully utilize advanced data buses having greater bandwidth, compared with conventional memory modules.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein can be applied to other apparatus and methods for a physical layout of simultaneously sub-accessible memory modules, and not just to the embodiments described above and shown in the accompanying figures. Accordingly, the scope of the invention should be determined from the following claims.

The invention claimed is:
1. A method of accessing and processing data in memory comprising a plurality of electrically isolated sectors, each sector comprising at least one memory device, the method comprising:
receiving at two or more memory devices of different sectors respective control and address signals;
processing the respective control and address signals; and simultaneously accessing the two or more memory devices of different sectors based on the respective control and address signals.

2. The method of claim 1, wherein processing the control and address signals comprises multiplexing data signals.

3. The method of claim 1, wherein processing the control and address signals comprises de-multiplexing data signals.

4. The method of claim 1, wherein processing the control and address signals comprises encoding data signals.

5. The method of claim 1, wherein processing the control and address signals comprises decoding data signals.

6. A method of accessing and processing data in a memory comprising a plurality of memory devices organized into a plurality of memory ranks, each memory rank comprising a plurality of electrically isolated memory devices, the method comprising:

receiving at two or more electrically isolated memory devices of one or more memory ranks respective control and address signals;

processing the respective control and address signals; and simultaneously accessing the two or more electrically isolated memory devices of one or more memory ranks based on the respective control and address signals.

7. The method of claim 6, wherein receiving control and address signals comprise receiving control and address signals at a driver chip.

8. The method of claim 6, wherein receiving control and address signals comprises receiving control and address signals at a plurality of driver chips.

9. The method of claim 6, wherein simultaneously accessing two or more memory devices of one or more memory comprises simultaneously writing to the two or more memory devices of the one or more memory ranks based on the control and address signals.

10. The method of claim 6, wherein simultaneously accessing two or more memory devices of one or more memory comprises simultaneously reading from the two or more memory devices of the one or more memory ranks based on the control and address signals.

11. The method of claim 6, wherein the control and address signals comprise optical signals.

12. The method of claim 6, wherein the control and address signals comprise RF signals.

13. A method of accessing and processing data in a memory comprising a plurality of memory devices divided into a plurality of memory ranks, each memory rank comprising a plurality of electrically-isolated memory devices, the method comprising:

receiving at two or more memory ranks respective control and address signals;

processing the respective control and address signals; and simultaneously accessing the two or more memory ranks based on the respective control and address signals.

14. The method of claim 13 wherein simultaneously accessing two or more memory ranks comprises simultaneously accessing a first memory device of a first sector and a second memory device of a second sector, the first and second memory devices associated with a first rank, the first and second memory devices of the first and second sectors electrically-isolated.

15. The method of claim 13 wherein simultaneously accessing two or more memory ranks comprises simultaneously accessing memory devices of a first sector and accessing memory devices of a second sector, the memory devices of the first sector associated with a first rank and the memory devices of the second sector associated with a second rank, the memory devices of the first sector electrically-isolated from the memory devices of the second sector.

16. The method of claim 13 wherein simultaneously accessing two or more memory ranks based comprises independently and simultaneously accessing two or more memory ranks.

17. The method of claim 13 wherein receiving control and address signals comprises receiving independent control and address signals for each memory rank.

18. The method of claim 13 wherein processing the control and address signals comprises processing the control and address signals at a respective driver for each memory rank.

19. The method of claim 13 wherein receiving control and address signals comprises receiving control and address signals for a first memory rank at a first driver associated with the first memory rank and receiving control and address signals for a second memory rank at a second driver associated with the second memory rank.

20. A method of accessing and processing data in a memory comprising a plurality of memory devices segmented into a plurality of electrically-isolated memory sectors, each memory sector comprising a plurality of memory devices, the method comprising:

receiving at two or more memory sectors respective control and address signals;

processing the respective control and address signals; and simultaneously accessing the two or more memory sectors based on the respective control and address signals.

21. The method of claim 20 wherein simultaneously accessing two or more memory sectors comprises independently and simultaneously accessing two or more memory sectors based on the control and address signals.

22. The method of claim 20 wherein simultaneously accessing two or more memory sectors comprises executing a high peak current event on a memory device of a first sector out of phase with executing a sensitive event on a memory device of a second sector different from the first sector.

* * * * *